US011310907B2

(12) United States Patent
Dogiamis et al.

(10) Patent No.: US 11,310,907 B2
(45) Date of Patent: Apr. 19, 2022

(54) MICROELECTRONIC PACKAGE WITH SUBSTRATE-INTEGRATED COMPONENTS

(71) Applicant: Intel Corporation, Santa Clara, CA (US)

(72) Inventors: Georgios Dogiamis, Chandler, AZ (US); Aleksandar Aleksov, Chandler, AZ (US); Feras Eid, Chandler, AZ (US); Telesphor Kamgaing, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 33 days.

(21) Appl. No.: 16/697,699

(22) Filed: Nov. 27, 2019

(65) Prior Publication Data

US 2021/0160999 A1 May 27, 2021

(51) Int. Cl.
| | |
|---|---|
| *H05K 1/02* | (2006.01) |
| *H05K 1/16* | (2006.01) |
| *H05K 3/12* | (2006.01) |
| *H05K 3/40* | (2006.01) |
| *H05K 9/00* | (2006.01) |

(52) U.S. Cl.
CPC ......... *H05K 1/0233* (2013.01); *H05K 1/0218* (2013.01); *H05K 1/165* (2013.01); *H05K 3/1275* (2013.01); *H05K 3/4038* (2013.01); *H05K 9/0037* (2013.01); *H05K 2201/1006* (2013.01); *H05K 2201/10068* (2013.01); *H05K 2201/10098* (2013.01)

(58) Field of Classification Search
CPC ................. H05K 1/0233; H05K 1/165; H05K 2201/1006; H05K 2201/10068; H05K 2201/10098
See application file for complete search history.

(56) References Cited

U.S. PATENT DOCUMENTS

| | | | | |
|---|---|---|---|---|
| 6,362,525 | B1* | 3/2002 | Rahim | H01L 23/49838 257/528 |
| 7,135,951 | B1* | 11/2006 | Sidhu | H01F 17/0013 336/200 |
| 2011/0156224 | A1* | 6/2011 | Rokuhara | H01L 23/66 257/659 |
| 2011/0298103 | A1* | 12/2011 | Yoo | H01L 23/552 257/659 |
| 2013/0207230 | A1* | 8/2013 | Jin | H01L 28/10 257/531 |
| 2014/0117494 | A1* | 5/2014 | Jing | H01L 23/645 257/531 |
| 2015/0279789 | A1* | 10/2015 | Mahajan | H01L 24/16 257/659 |
| 2017/0092556 | A1* | 3/2017 | Gustafson | H01L 21/4846 |
| 2018/0098417 | A1* | 4/2018 | Gebauer | H01F 41/041 |
| 2021/0041182 | A1 | 2/2021 | Eid et al. | |
| 2021/0043541 | A1 | 2/2021 | Eid et al. | |

(Continued)

*Primary Examiner* — Hoa C Nguyen
(74) *Attorney, Agent, or Firm* — Patent Capital Group

(57) ABSTRACT

Embodiments may relate to a microelectronic package or a die thereof which includes a die, logic, or subsystem coupled with a face of the substrate. An inductor may be positioned in the substrate. Electromagnetic interference (EMI) shield elements may be positioned within the substrate and surrounding the inductor. Other embodiments may be described or claimed.

13 Claims, 10 Drawing Sheets

(56) References Cited

U.S. PATENT DOCUMENTS

2021/0043544 A1    2/2021    Eid et al.
2021/0043573 A1    2/2021    Eid et al.
2021/0119552 A1*  4/2021    Leong .................... H05K 1/181

* cited by examiner

MICROELECTRONIC PACKAGE WITH SUBSTRATE-INTEGRATED COMPONENTS

BACKGROUND

It may be desirable for discrete dies, and particularly radio frequency (RF) related dies such as power amplifiers (PAs) to be communicatively coupled to one another or to other dies on a RF system in package (SiP). Often, such SiPs use wirebonds and two-dimensional (2D) integration schemes to couple various of the dies to one another.

DETAILED DESCRIPTION

Figure 1:
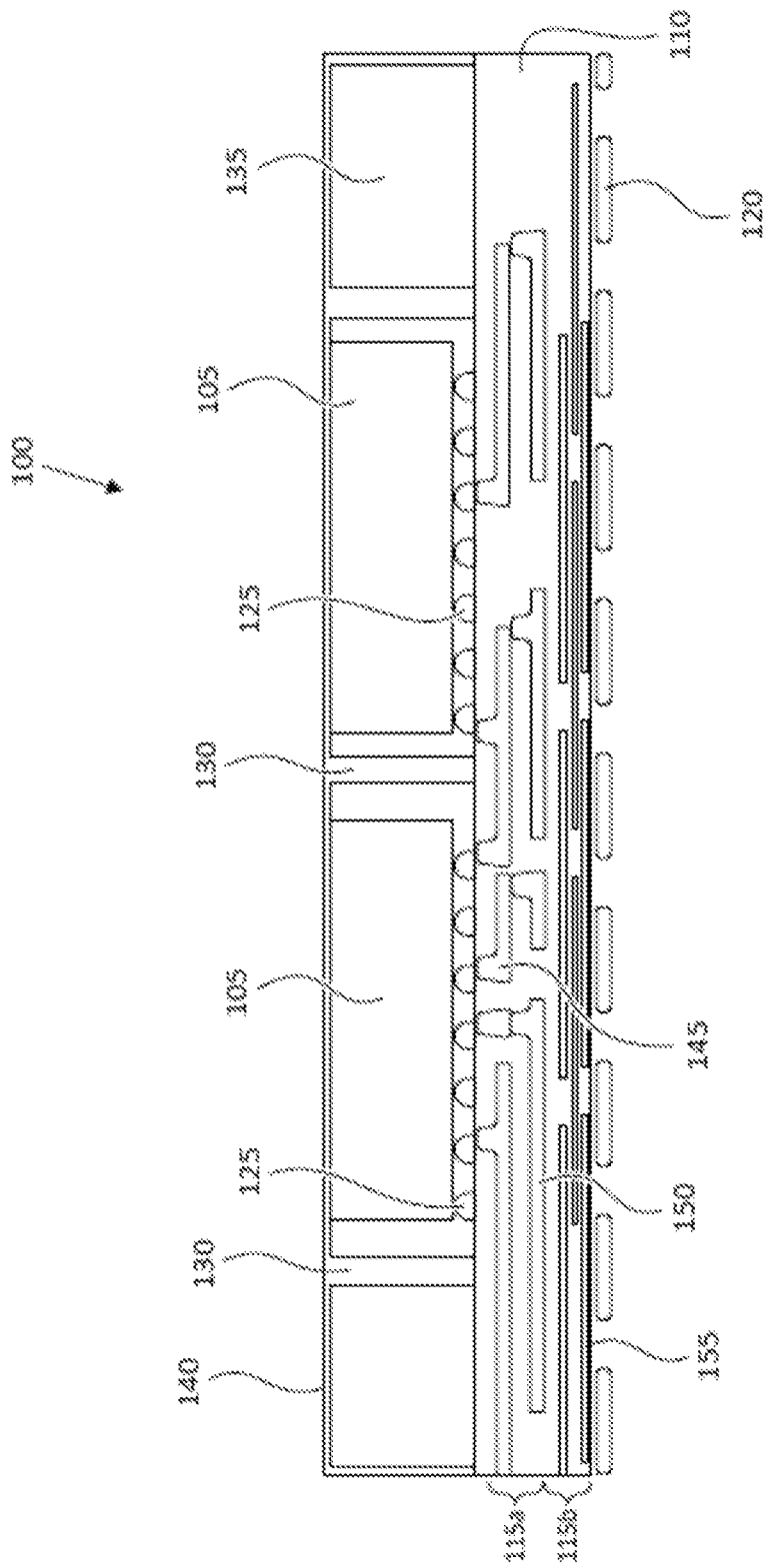
FIG. 1 depicts an example microelectronic package with substrate-integrated components, in accordance with various embodiments.
Figure 2:
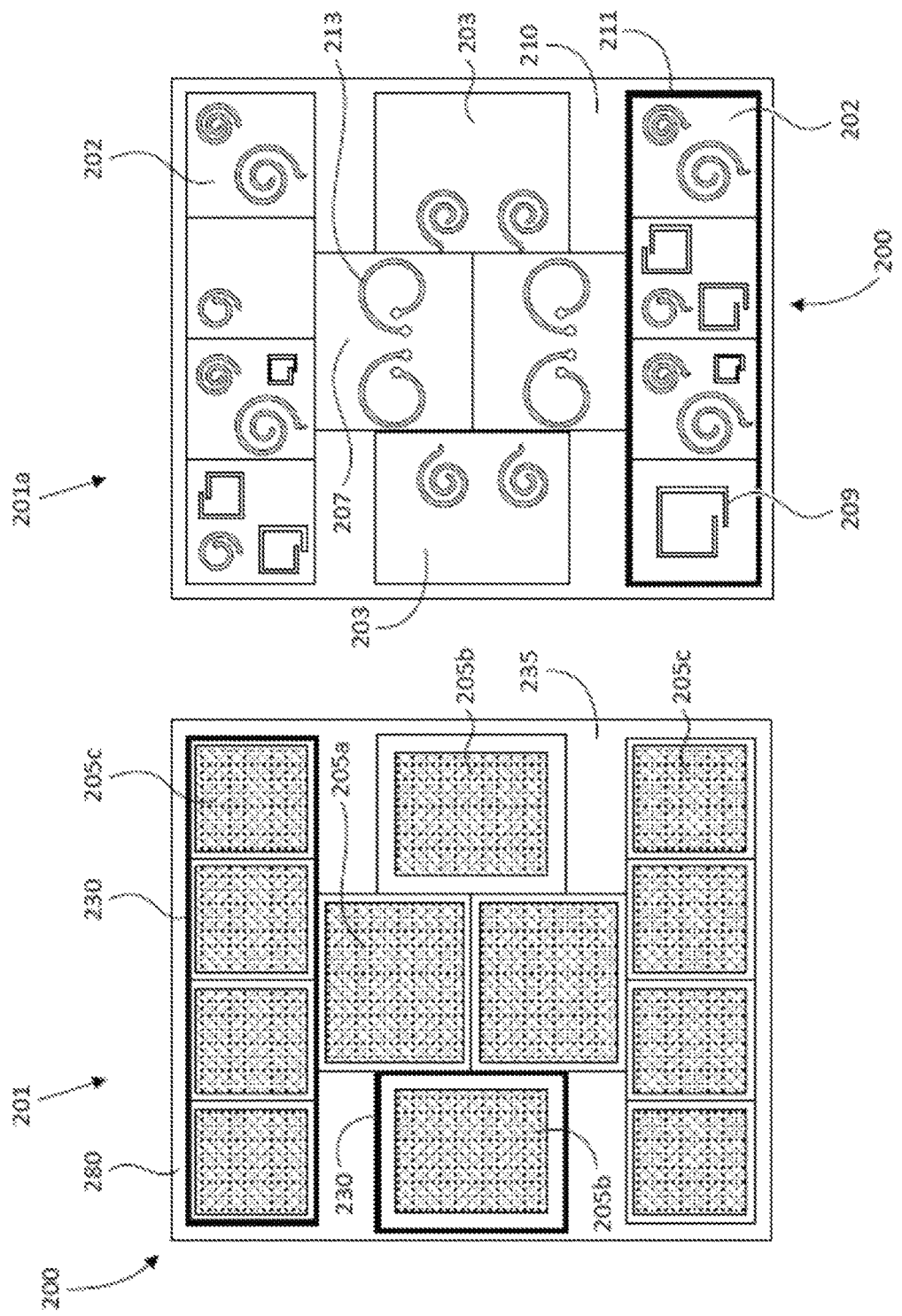
FIG. 2 depicts example top-down views of an example microelectronic package with substrate-integrated components, in accordance with various embodiments.
Figure 3:
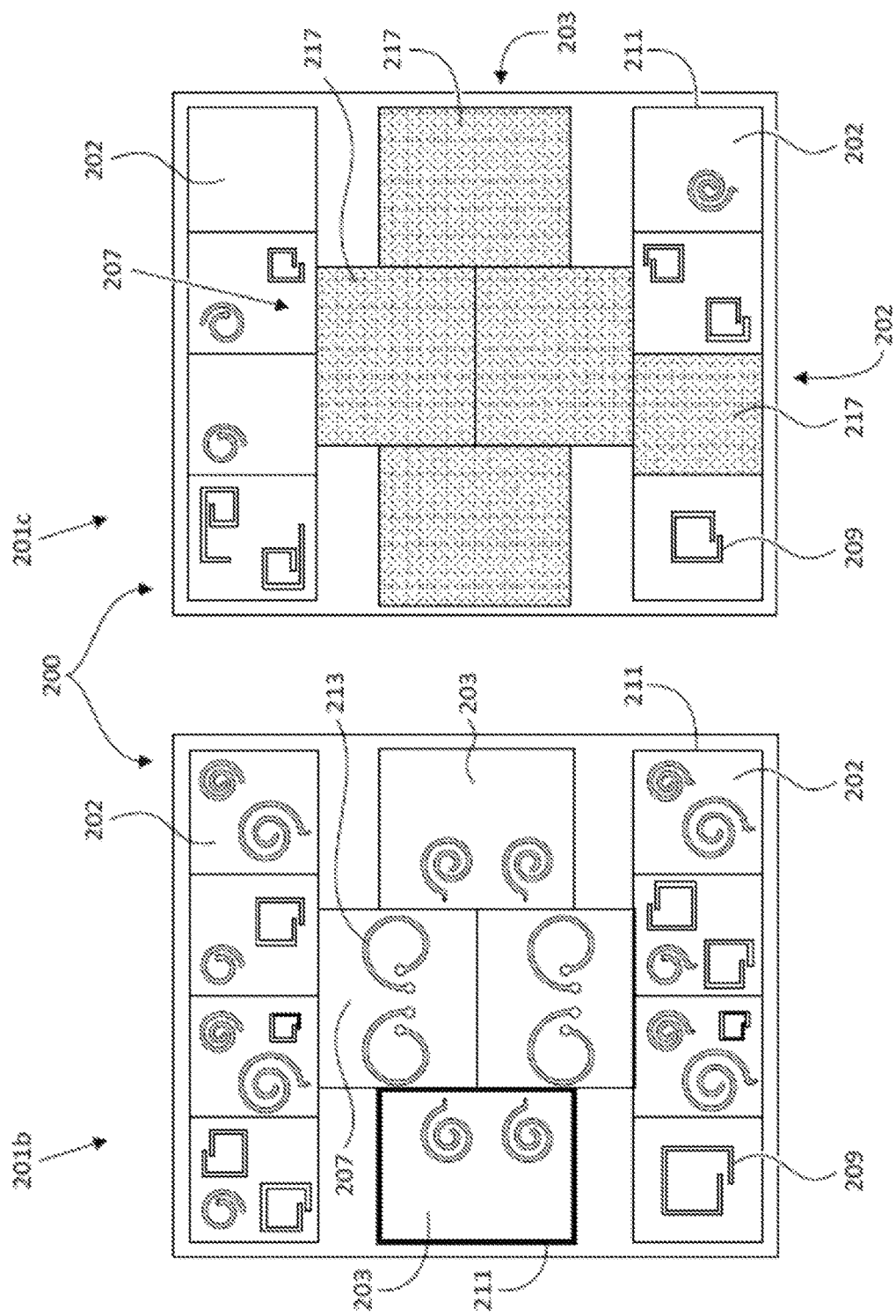
FIG. 3 depicts example top-down views of an example microelectronic package with substrate-integrated components, in accordance with various embodiments.
Figure 4:
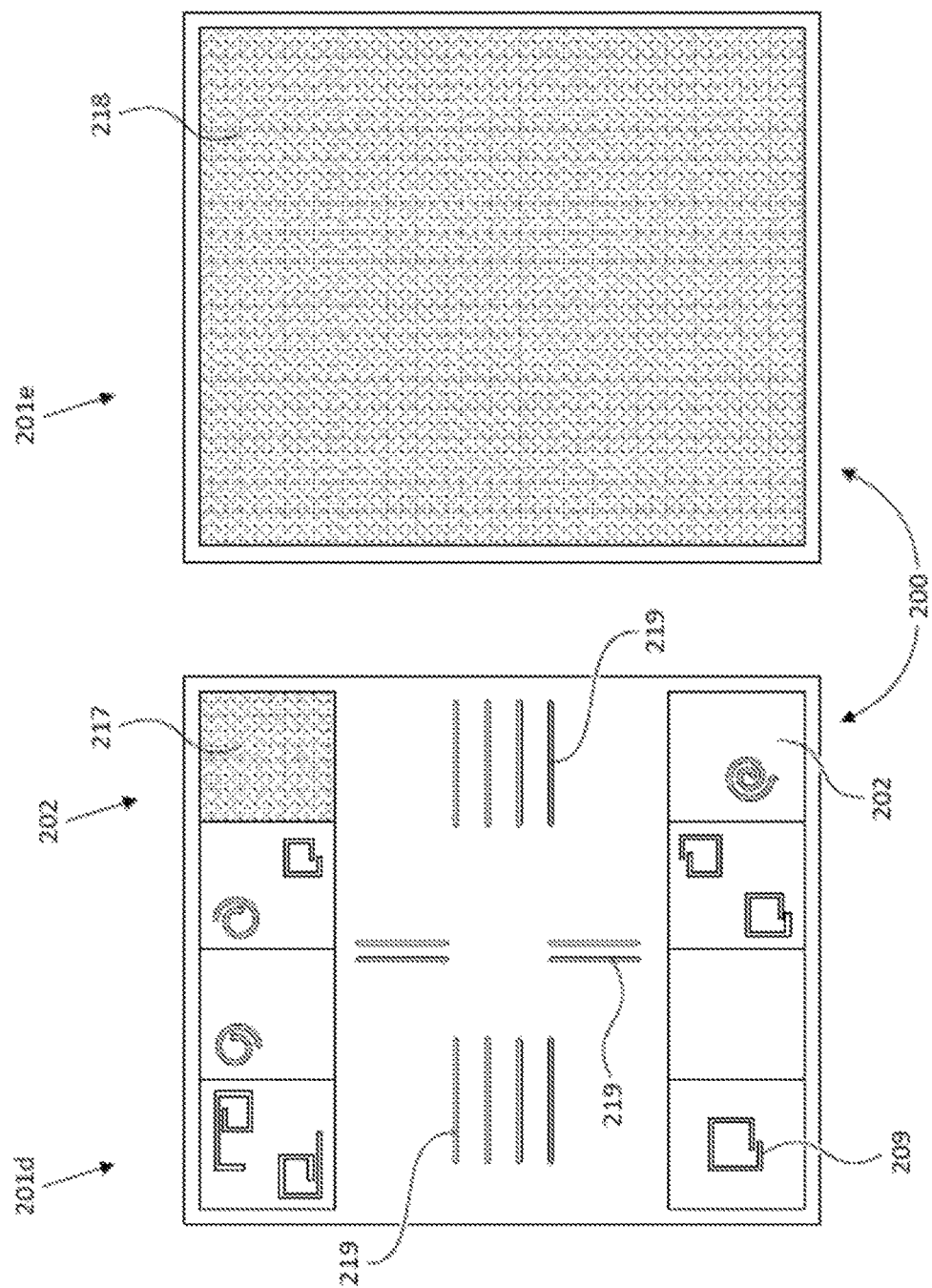
FIG. 4 depicts example top-down views of an example microelectronic package with substrate-integrated components, in accordance with various embodiments.
Figure 5:
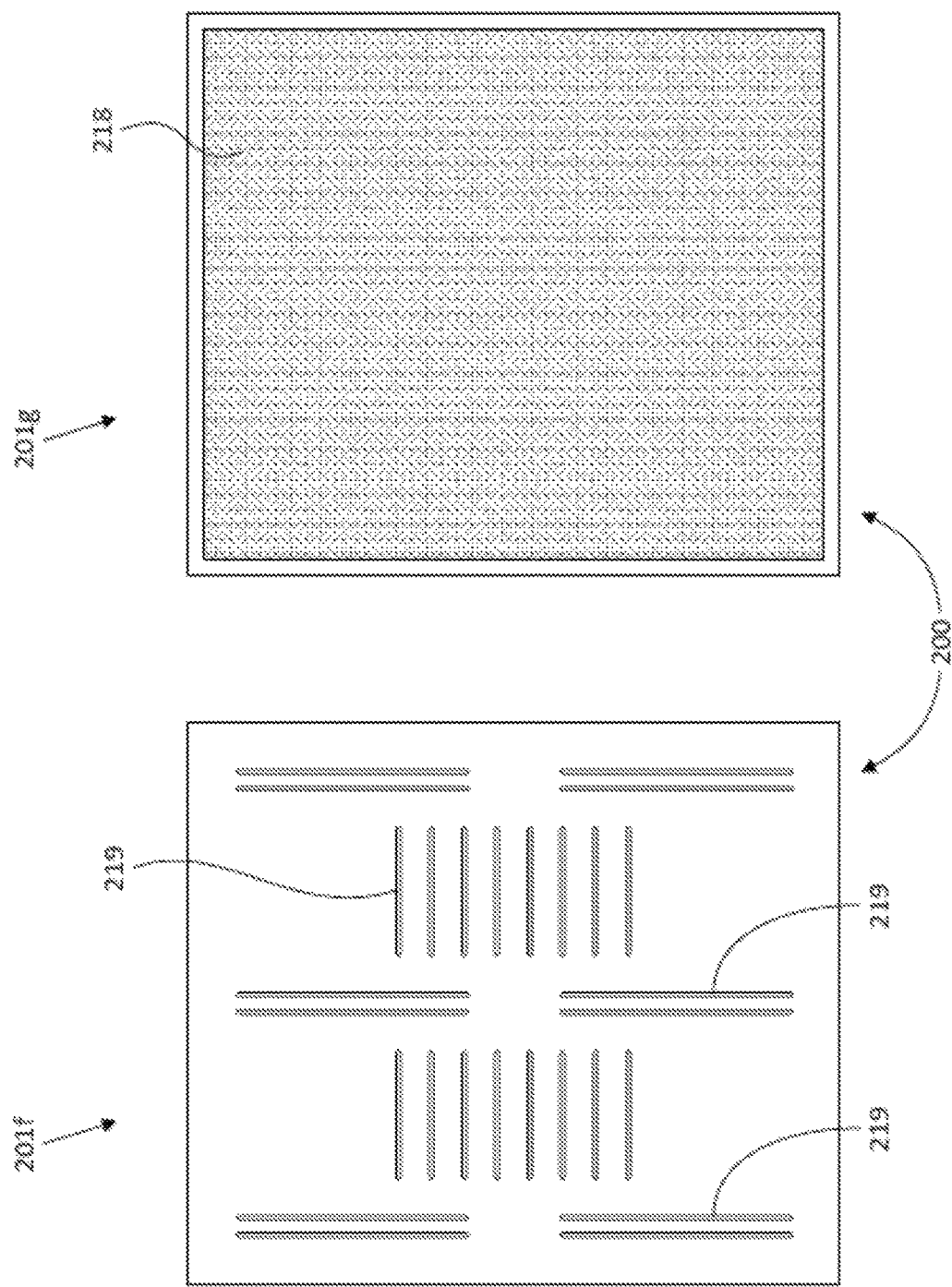
FIG. 5 depicts example top-down views of an example microelectronic package with substrate-integrated components, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature on a second feature," may mean that the first feature is formed/deposited/disposed/etc. over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an application-specific integrated circuit (ASIC), an electronic circuit, a processor (shared, dedicated, or group) or memory (shared, dedicated, or group) that execute one or more software or firmware programs, a combinational logic circuit, or other suitable components that provide the described functionality.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

As previously noted, it may be desirable for dies such as power amplifiers (PAs), switches, control logic, low noise amplifiers (LNAs) to be connected to one another or to other dies in or on a microelectronic package such as a RF SiP. In legacy microelectronic packages, wirebonds may have been used to connect the dies first to the package substrate, and then through the package substrate (and particularly interconnects in the package substrate) to other passive or active components or dies of the microelectronic package.

Additionally, legacy microelectronic packages may have commonly used planar 2D integration schemes where all the components of the microelectronic package were in a single layer and adjacent to one another. These schemes may have relied on the use of semiconductor packaging materials (e.g., low-temperature co-fired ceramic (LTCC), organic, or some other type of semiconductor package material) to interconnect between the different components in the SiP. In these legacy microelectronic packages, architectures with up to 10 metal layers may have been used in conjunction with a second level interconnect (SLI) of a ball grid array (BGA) or land grid array (LGA) type. Several (e.g., greater than 40) passive devices such as resistors, inductors, or capacitors may be mounted as surface mount devices (SMDs) on the package, or may be implemented as integral elements of the package substrate utilizing the metal layers of the package substrate. Additionally, if high-Q inductors are desired, those may be placed in or on the outermost metal layers of the package substrate, while lower-Q inductors may use up to 4 metal layers of the package substrate. The microelectronic package may then be overmolded to protect the devices from the environment.

In addition, an electromagnetic interference (EMI) solution may be implemented in legacy packages as a conductive thin layer of a material (e.g., copper (Cu) or some other similar metal or non-metal material) that covers the outer surface of the microelectronic package and is connected to ground layers of the microelectronic package, resulting in a structure akin to that of a "Faraday cage."

Further, wirebonds may be used in legacy packages to shield specific devices from interference while via walls inside the package may further help for crosstalk reduction. The thermal solution (for the dies or other components of the microelectronic package) may be implemented using an array of thermal vias inside of the packaging substrate, since the current solution may use a face-up approach (i.e., with the active side of the die or SMD facing away from the package substrate) for assembling the dies in the system. The wirebonds may be used to interconnect the dies or SMDs to the package substrate.

Generally, filters in legacy packages may include the interconnection of several (e.g., 10-20) acoustic resonator dies such as surface acoustic wave (SAW) resonators, bulk acoustic wave (BAW) resonators, thin-film bulk acoustic resonators (FBARs), or some other type of resonator may be included along with appropriate matching circuits such as inductors, Typically, 3 or 4 layers of the package substrate may have been occupied by the matching inductors underneath the die shadow. Other dies such as integrated passive devices (IPDs), switches, digital logic dies, etc. may also be placed on the package and may likewise need to be interconnected using wirebonds.

However, the thermal solution of legacy packages, especially for face-up mounted dies, heat may only be extracted through the die into the substrate on which the die is mounted, for example through via arrays. This solution may render layers below the die shadow to be undesirable for signal routing. However, as die performance, and particularly PA performance, requirements become more stringent, this heat extraction path may be insufficient to meet design criteria. However, since face-up die interconnects to the package substrate are wirebonds in legacy packages, there may be no practical solution to extract heat from the top of the die (e.g., the portion of the die that is facing away from the package substrate). Such heat extraction from the top of the die could be desirable, because any such mechanisms would necessarily be close to the active side of the die, and therefore the heat extraction could be more efficient than the legacy techniques.

Additionally, wirebonds in legacy microelectronic packages can lead to an increase in package area due to design rules on how the wire can be guided from the pad of the die to the pad of the substrate. Specifically, if wirebonds are used for RF shielding, then the wirebonds may noticeably increase z-height of the microelectronic package.

Finally, in 2D planar approaches, the trace lengths may be increased in order to interconnect the various dies and components of the microelectronic package, which may lead to reduced space available for additional components, increased layer count of the package substrate, or increased costs of the microelectronic package.

In contrast to the legacy microelectronic packages described above, embodiments herein relate to the use of wafer reconstitution and increased functionality integration on a single die in order to achieve a small form factor and reduction of packaging layers. Additionally, vias such as through-mold vias (TMVs) or through-substrate vias (TSVs) may be employed to further reduce z-height and achieve improved crosstalk parameters. Thick and thin redistribution layers may be used for high-Q inductor integration or signal routing, respectively.

Embodiments may provide a number of advantages. For example, embodiments may result in a reduction of X-Y size of the microelectronic package. Moreover, with the use of flip-chip dies, the total z-height of the microelectronic package may be reduced. Also, increased functionality integration on a single die may allow for the use of a reduced number of packaging layers, resulting in both z-height and X-Y area reduction. High-Q inductors (e.g., inductors with a Q-factor greater than approximately 50) may be integrated using a combination of thick redistribution layers and lithographically defined vias. Routing and lower-q inductors and capacitors may be integrated in thin redistribution layers at the bottom of the interconnect stack. TMVs and mold interconnects may create EMI shields for dies of the microelectronic package. Therefore, z-height may be kept low because EMI measures may use the mold metal layer instead of wirebonds. Embodiments may further result in improved thermal parameters with an added thermal path through the mold.

FIG. 1 depicts an example microelectronic package 100 with substrate-integrated components, in accordance with various embodiments. In some embodiments, the microelectronic package 100 may be referred to as a RF front-end module (FEM), while in other embodiments the microelectronic package 100 may be part of, or may include elements of, a RF FEM.

Generally, the package 100 may include one or more dies 105 coupled with a package substrate 110. The dies 105 may be or include, for example, a processor such as a central processing unit (CPU), general processing unit (GPU), a core of a distributed processor, or some other type of processor. Alternatively, the die 105 may be include a memory such as a double data rate (DDR) memory, a nonvolatile memory (NVM), a volatile memory, a read-only memory (ROM), or some other type of memory or die. In some embodiments the die 105 may be or include a RF chip or RF circuitry that is configured to generate, process, transmit, or receive a wireless signal such as a third generation (3G), a fourth generation (4G), a fifth generation (5G), a Wi-Fi, or some other type of wireless signal. For example, the dies may be an IPD, a switch, digital logic, a power amplifier, a low noise amplifier or some other type of RF-related die. In some embodiments the die 105 may include one or more passive components such as capacitors, resistors, etc. The various active or passive components may be positioned within, partially within, or on the surface of the die 105.

The package substrate 110 may be, for example, considered to be a cored or coreless substrate. The package substrate 110 may include one or more layers of a dielectric material which may be organic or inorganic. The package substrate 110 may further include one or more conductive elements such as vias, pads, traces, microstrips, striplines, etc. The conductive elements may be internal to, or on the surface of, the package substrate. Generally, the conductive elements may allow for the routing of signals through the package substrate 110, or between elements that are coupled to the package substrate 110. In some embodiments the package substrate 110 may be, for example, a printed circuit board (PCB), an interposer, a motherboard, or some other type of substrate.

Generally, the die 105 may be coupled with the package substrate 110 by one or more interconnects 125. The interconnects 125 may be, for example, solder bumps that are formed of a material such as tin, silver, copper, etc. If solder bumps are used for the interconnects 125, then the solder bumps may be elements of a BGA as shown in FIG. 1. In other embodiments, the interconnects 125 may be some other type of interconnect. Generally, the interconnects 125 may physically or communicatively couple the die 105 with the package substrate 110. For example, one or more of the interconnects 125 may physically couple with, and allow electrical signals to pass between, pads of the die 105 and pads of the package substrate 110 (not shown for the sake of elimination of clutter of FIG. 1). In other embodiments, the interconnects 125 may physically couple the die 105 and the package substrate 110, but the interconnects 125 may not communicatively couple the die 105 and the package substrate 110.

The package substrate 110 may further include a number of interconnects 120, which may be referred to as SLIs. The interconnects 120 may be formed of a material similar to that of interconnects 125 described above. For example, the interconnects 125 may be formed of a solder material that includes tin, silver, copper, etc. The interconnects 125 may be solder bumps of a BGA, while in other embodiments the interconnects 125 may be elements of a solder grid array (SGA), a LGA, a pin grid array (PGA), etc. Generally, the interconnects 120 may communicatively couple, physically couple, or communicatively and physically couple the microelectronic package 100 with another element of an electronic device such as a motherboard, an interposer, a PCB, etc.

The microelectronic package 100 may further include an overmold material 135 which may at least partially surround the dies 105. The overmold material 135 may be or include a dielectric material such as epoxy or some other overmold material. One or more TMVs 130 may be positioned in the overmold material. The TMVs may be formed of a material such as copper or some other type of electrically conductive material. Generally, as can be seen, the TMVs 130 may generally go from the package substrate 110 to an EMI shield layer 140 positioned on the overmold material 135. Similarly to the TMVs 130, the EMI shield layer 140 may be formed of an electrically conductive material such as copper or some other material. Although not explicitly shown in FIG. 1, the EMI shield layer 140 may be communicatively coupled with a ground plane of the microelectronic package 100 or the electronic device of which the microelectronic package is a part. The EMI shield layer 140 and the TMVs 130 may at least partially surround the dies 105 and serve as an EMI shield to the dies 105. For example, the TMV 130 positioned between the two dies 105 may reduce or eliminate EMI interference (i.e., crosstalk) between the two dies 105, or between one of the dies 105 and another element of an electronic device of which the microelectronic package 100 is a part.

As previously noted, the package substrate 110 may include one or more conductive elements such as vias, pads, traces, microstrips, striplines, etc. These elements may be formed of a conductive material such as copper, gold, or some other material. In some embodiments, lateral elements such as traces, striplines, microstrips, etc. may be referred to as redistribution layers. As can be seen, the package substrate 110 may include redistribution layers 115a, for example with trace 150, with a first thickness, and redistribution layers 115b, for example with trace 155, with a second thickness.

The first thickness, i.e., the thickness of trace 150, may be greater than approximately 30 micrometers ("microns") as measured in a direction from the top of FIG. 1 to the bottom of FIG. 1. The second thickness, i.e., the thickness of trace 155, may be less than approximately 30 microns. Generally, the redistribution layers 115a may be used as matching inductors for dies 105. Inductors from the redistribution layers 115a may be high-Q inductors, for example having a Q-factor of greater than approximately 50. The redistribution layers 115b may be used for lower-Q inductors (e.g., inductors with a Q-factor on the order of less than 50) or signal routing (e.g., of digital, baseband, or RF signals) through the package substrate 110. Additionally, as can be seen, various of the traces 155 and 150 of the redistribution layers may be coupled by one or more TSVs 145. The TSVs 145 may be lithographically defined and may be singular vias that communicatively couple two elements or may be, for example, trench vias which extend laterally through the package substrate 110. The trench vias may, for example, be used to form an inductor as will be described in further detail with respect to FIG. 6.

FIGS. 2-5 depict example top-down views of an example microelectronic package with substrate-integrated components, in accordance with various embodiments. Specifically, FIGS. 2-5 depict example views at different levels of the microelectronic package 200. Specifically, FIGS. 2-5 depict views 201, 201a, 201b, 201c, 201d, 201e, 201f, and 201g. Progressively enumerated views may be at descending levels of the microelectronic package (as oriented in FIG. 1). Specifically, view 201 is a view taken through the overmold material and the dies such as overmold material 135 and dies 105 of FIG. 1. Views 201a-201d are cross-sectional descending views of redistribution layers of the microelectronic package 200 with redistribution layers with a higher thickness (e.g., a thickness above approximately 30 microns) than the redistribution layers of views 201e-201g (which may have a thickness below approximately 30 microns). Specifically, views 201a-201d are views of redistribution layers that are in a region similar to that of redistribution layers 115a, and views 201e-201g are views of redistribution layers that are in a region similar to that of redistribution layers 115b. View 201a may be of a redistribution layer that is adjacent to the cross-sectional view of view 201; view 201b may be of a redistribution layer that is adjacent to the redistribution layer of view 201a; view 201c may be of a redistribution layer that is adjacent to that of view 201*b*; etc. It will be understood that each and every element of each Figure may not be explicitly enumerated or called out, but elements that share characteristics of an enumerated element within a Figure or between Figures may generally share characteristics described with respect to that enumerated element.

Starting with view 201, the microelectronic package 200 may include a number of dies 205*a*, 205*b*, and 205*c* (collectively referred to as dies 205). Respective ones of the dies 205 may have different functions. For example, dies 205*c* may be filters such as acoustic wave resonator (AWR) filters. The dies 205*b* may be, for example, a switch, an IPD, a digital logic, or some other type of die. Dies 205*a* may be, for example, a PA or some other type of die. The dies 205 may be positioned in an overmold material 235, which may be similar to, and share one or more characteristics with, overmold material 135. As can be seen in view 201, the overmold material 235 may generally surround the dies 205.

Various of the dies 205 may be surrounded by TMVs 230, which may be similar to, and share one or more characteristics with, TMVs 130. Specifically, the TMVs 230 may be formed of a conductive material such as copper or some other material and serve to electromagnetically shield the dies 205 from one another. Additionally, if the TMVs 230 are coupled with an EMI shield layer such as EMI shield layer 140, the TMVs 230 and the EMI shield layer may electromagnetically shield the dies 205 from EMI caused by components external to the microelectronic package 200.

It will be understood that although the TMVs 230 are depicted as generally square or rectangular-shaped unitary elements, in other embodiments the TMVs 230 may have different shapes (e.g., oval, circular, etc.) In some embodiments, one or more of the dies 205 may not be surrounded by a TMV. In some embodiments, rather than a unitary element, one or more of the TMVs 230 may be made up of a series of discrete TMVs that are spaced closely enough together that they may provide EMI shielding for one of the dies 205. In some embodiments the TMVs 230 may be conductively connected to the respective TMVs and ground planes of views 201*a*-201*g*.

View 201*a* depicts a view of a redistribution layer of the microelectronic package 200 that is adjacent to the elements of view 201. Specifically, the microelectronic package 200 may include a package substrate 210 which is similar to, and shares one or more characteristics with, package substrate 110. The package substrate 210 may include a number of cavities such as cavities 202, 203, 207, etc. As can be seen, the cavities may be generally aligned with the dies 205. Specifically, cavities 202 may align with dies 205*c*, cavities 203 may align with dies 205*b*, and cavities 207 may align with dies 205*a*. It will be understood, however, that this alignment may differ in other embodiments and the cavities may not fully align with one or more of the dies, or a single cavity may be defined in the die shadow of two dies. As used herein, the term "die shadow" may refer to the space in the package substrate 210 that is beneath one of the dies such as dies 205*a*/205*b*/205*c*. Similarly, as used herein, the term "cavity" may refer to a an area that is surround by conductive elements that electromagnetically decouple that area from other electrically or electromagnetically active areas.

The cavities 202, 203, and 207 may be defined by traces 211, which may be similar to traces 115. Within the cavities 202, 203, and 207, further traces may define one or more elements such as inductors. Various of the inductors may have different numbers of loops, or be sized differently. For example, inductors 213 within cavity 207 may be relatively large and generally circular, whereas inductors 209 within a cavity such as cavity 202 may be generally square shaped. Certain of the inductors may be, for example, inductors used for AWR-based filters, PA and LNA matching networks, or some other type of inductor.

View 201*b* is a cross-sectional view of a redistribution layer that is adjacent to that of view 201*a*. As can be seen, the redistribution layer of view 201*b* may share several elements that are similar or identical to those of the redistribution layer of view 201*a*. Several of the elements of the redistribution layer of view 201*b* may be communicatively coupled with elements of the redistribution layer of view 201*a* by one or more TSVs such as TSVs 145 (which are not shown in the Figures based on the locations at which the views were taken). For example, the TSVs may communicatively couple the inductor 209 of the redistribution layer of view 201*b* with the inductor 209 of the redistribution layer of view 201*a*. In this manner, a multi-loop inductor may be formed in a plurality of layers of the microelectronic package 200. Similarly, the inductor 213 of view 201*b* may be communicatively coupled with the inductor 213 of the redistribution layer of view 201*a* by one or more TSVs.

In some embodiments, the TSVs may be a one or more distinct vias, wherein respective ones of the plurality of vias are coupled with, e.g., the inductors 209 at different locations along the inductors. In other embodiments, the TSVs may be a "trench via" which extends laterally along the length, width, or both of the microelectronic package 200. These trench vias, combined with the traces that form the inductors, may together form a relatively large inductor element with an overall thickness that is the thickness of the traces that form the inductor 209 on two levels of the redistribution layer, as well as the thickness of the TSV. Further details of the inductors may be discussed below with respect to FIG. 6.

Similarly to the inductors 209, the traces 211 may be coupled to one another by one or more TSVs. By coupling the traces 211 together with one or more TSVs, the traces 211 and TSVs may form EMI shielding for the cavities 203, 202, 207, etc. and, more particularly, for elements within those cavities such as the inductors 209/213. Additionally, TSVs may communicatively couple the traces 211 of the redistribution layer of view 201*a* with the TMVs 230 of the view 201 of the microelectronic package. In this way, a die 205 and the inductors located in its die shadow such as inductors 209 or 213 may be jointly shielded in a cavity within the microelectronic package.

As discussed above with respect to TMVs 230, although the traces 211 and the TSVs may be depicted or discussed as unitary elements, in some embodiments the traces 211 or the TSVs that couple the traces 211 may be distinct elements that are spaced closely enough together to provide EMI shielding for the cavities. For example, in some embodiments one or more of the cavities 202/203/207 may not be surround by traces, but instead may be surrounded by a plurality of distinct unitary pads that are communicatively coupled together by TSVs or trench vias. Other variations may be present in other embodiments.

View 201*c* depicts a view of a redistribution layer that is adjacent to the redistribution layer of view 201*b*. As may be seen, the redistribution layer of view 201*c* may include elements that are similar to those of the redistribution layers of views 201*a* and 201*b*. However, as may be seen, the redistribution layer of view 201*c* may include one or more EMI shields 217 located in, for example, cavities such as a cavity 202, a cavity 203, or a cavity 207. The EMI shields 217 may be coupled with a ground plane (e.g., ground plane 218 of the views 201*e* or 201*g* of redistribution layers further down the interconnect stack) of the microelectronic package 200. The EMI shields 217 may be communicatively coupled by one or more discrete TSVs, trench vias, or some other type of TSV with the traces 211 that define a cavity with which the EMI shields 217 are aligned. In this way, the EMI shields 217, the TSVs, the TMVs, the traces, and the EMI shield layer discussed above with respect to, for example, element 140, may jointly encase one or more dies 205 and one or more inductors 209 or 211. This encasement may reduce or negate crosstalk between elements of the microelectronic package 200, or otherwise insulate elements of the microelectronic package 200 from EMI.

View 201d depicts a view of a redistribution layer that is adjacent to the redistribution layer of view 201c. As may be seen, the redistribution layer of view 201d may include some elements that are similar to those discussed above with respect to previous views. In addition, the redistribution layer depicted in view 201d may include one or more routing traces 219. The routing traces 219 may be used to communicatively couple elements of previous layers together (e.g., communicatively coupling an element of a cavity such as cavity 205a with an element of a cavity such as cavity 205b, another cavity 205a, a cavity 202, etc.).

View 201e depicts a view of a redistribution layer that is adjacent to the redistribution layer of view 201d. As previously noted, 201e may be a view of a redistribution layer that is in a region similar to that of redistribution layers 115b. More specifically, 201e may be a view of a redistribution layer with a thickness of less than approximately 30 microns. The redistribution layer may include a ground plane 218 of the microelectronic package 200. The ground plane 218 may be formed of a conductive material such as copper or some other material, and may be coupled to a ground of the microelectronic package 200, an electronic device of which the microelectronic package 200 is a part, or some other type of ground plane. The ground plane 218 may be communicatively coupled, for example by one or more TSVs, trench vias, routing traces 219, etc. to traces 211, EMI shields 217, or the EMI shield layer 140 as described above. In this way, the various elements that provide EMI protection to dies of the microelectronic package may be communicatively coupled to ground.

Views 201f and 201g depict further redistribution layers of the microelectronic package. Specifically, the redistribution layer of view 201f may be adjacent to the redistribution layer of view 201e, and the redistribution layer of view 201g may be adjacent to the redistribution layer of view 201f. The redistribution layers of views 201f and 201g may, similarly to the redistribution layer of view 201e, by a view of a redistribution layer with a thickness of less than approximately 30 microns. The redistribution layer of view 201g may include a ground plane 218 that is similar to the ground plane of the redistribution layer of view 201e. The redistribution layer of view 201f may include one or more routing traces 219 which may be similar to the routing traces 219 of the redistribution layer of view 201f.

It will be understood that the embodiments depicted in FIGS. 1-5 are intended as simplified example embodiments related to concepts herein. Specifically, in some embodiments one or more of the various cavities 202, 203, 207, etc. may include elements in addition to those depicted such as additional inductors, capacitors, resistors, or other circuitry. Additionally, although the various cavities are depicted and discussed as being entirely sealed by the traces 211 and the TSVs or TMVs, in some embodiments routing between various elements may be required and so there may be one or more breaks in the EMI shielding of the elements of the microelectronic package 200. Additionally, although the various cavities are depicted as generally square or rectangular shaped or as having a specific configuration, in other embodiments cavities may span more or fewer layers than discussed, may have a different cross-sectional shape, etc. Similarly, the microelectronic package 200 may have a different shape, more or fewer layers, etc. It will also be understood that the Figures are not intended to show each and every layer of the microelectronic package, and there may be additional layers that may include, for example, additional interconnects that allow the connection of additional dies, additional EMI shielding, etc. Other variations may be present in other embodiments.

It will be noted that the inductor 209 depicted in views 201a and 201b may be generally identical, and the inductor 209 depicted in views 201c and 201d may be generally identical. This may be because the inductor 209 occupies four total redistribution layers (e.g., the redistribution layers of views 201a-201d) and includes two sections that span two redistribution layers each. In other words, the inductor 209 may include a first section that spans the redistribution layers of views 201a and 201b, and a second section that spans the redistribution layers of views 201c and 201d. Each of the sections may include a trench via that couples the different layers of a section together. In other words, the microelectronic package 200 may include a first trench via that runs the length of, and couples, the inductor 209 of the redistribution layers of views 201a and 201b. Similarly, the microelectronic package 200 may include a second trench via that runs the length of, and couples, the inductor 209 of the redistribution layers of views 201c and 201d. As used herein, the term "trench via" may refer to a conductive element that spans between two layers (e.g., a via) that also has a width or length. Such a via may be, for example, lithographically formed in the package substrate.

Figure 6:
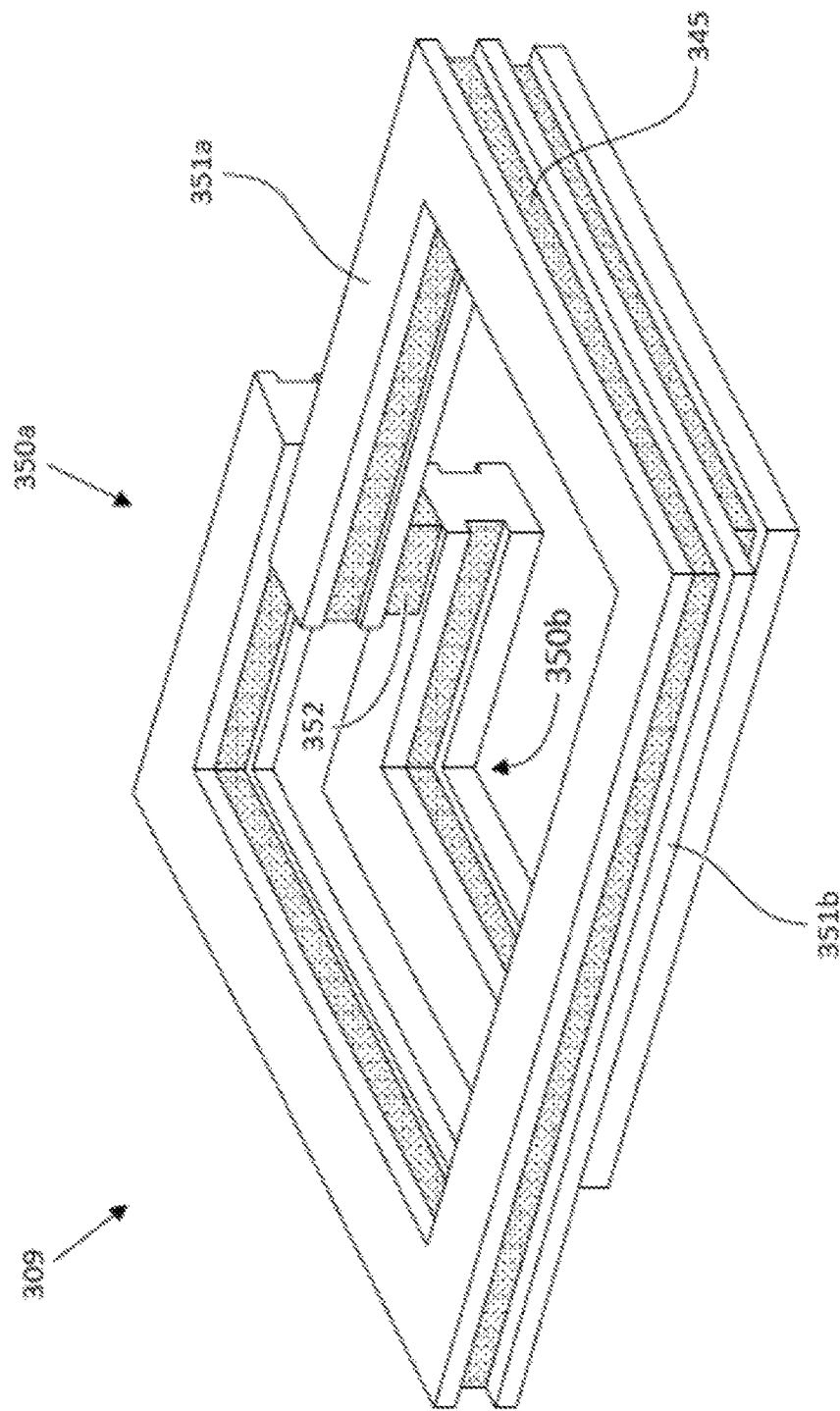
FIG. 6 depicts an example view of an in-package inductor, in accordance with various embodiments.

FIG. 6 depicts a perspective view of an example inductor 309, which may be similar to, and share one or more characteristics with, inductor 209. The inductor 309 may include two sections, 350a and 350b. The first section 350a may include two layers, 351a and 351b, which may be traces such as those depicted in views 201a and 201b. The layers 351a and 351b may be coupled to one another by a trench via 345 that runs along the length of, and between, the layers 351a and 351b. The second section 350b may likewise include two layers with a trench via positioned therebetween. The first section 350a and the second section 350b may be coupled with one another by a via 352 which may physically and electrically couple the two sections together.

The use of an inductor such as inductor 309 may provide significant benefits when positioned in the package substrate of a microelectronic package. Specifically, by forming the inductor out of different redistribution layers of the microelectronic package (e.g., layers 351a and 351b) and coupling the layers together by a trench via such as trench via 345, each of the sections of the inductor may have a thickness that is equivalent to the thickness of each of the redistribution layers and the trench via. This increased thickness may provide for a relatively high Q-value (e.g., a Q-value above approximately 50) for the inductor 309.

Generally, embodiments herein may provide a number of advantages as described above. In some embodiments, using a flip-chip type die for dies 105, 205a-c, etc. may allow for the total z-height to be reduced as compared to legacy microelectronic packages because the overall mold thickness may be reduced due to the lack of wirebonds. A total z-height for the microelectronic package of less than approximately 800 microns may be achieved. Additionally, the EMI solution may be further enhanced by using continuous TMVs or TSVs around the dies, which may also allow a smaller footprint for die placement. Additionally, although the die 205c is described as being a singular AWR filter, it may be understood that the AWR die may be a composite die that includes a shielding hermetic lid with or without integrated passive structures (e.g., capacitors or inductors).

It will be understood that although embodiments above are described with respect to a microelectronic package, in some embodiments in-substrate elements may be incorporated into, for example, a single die to form a die that integrates multiple functionalities. Integrating multiple functionalities on a single die may enable the optimization of the interface between different subsystems required for each functionality. For example, if both functionalities are in a single die, then off-chip matching networks may be reduced or eliminated.

Each of the multiple functionalities may be, for example, a functionality related to an RF FEM and is implemented as digital logic in the die. For example, the die may include a first subsystem related to a PA, and other subsystems related to an IPD, a switch, digital logic, etc. In some embodiments, the die may include multiple subsystems, each related to an AWR filter. The various subsystems, or their associated components such as matching networks, inductors, etc. may be interconnected on the die itself rather than through a package substrate to which the die is coupled, and thereby lead to a reduction of the total package metal layer count as well as a reduction of total XY area of the microelectronic package. For example, if a subsystem related to digital logic and a subsystem related to an RF switch are integrated on the same die, then no package interconnect may be necessary at the package-substrate level to interconnect the two subsystems, which may lead to a decrease of at least one or two package metal layers. Similarly, introducing inductors on an AWR die (or a composite die if a shielding lid is included) may further reduce the medal layers needed in the package substrate because the interconnect between the AWR die and the inductors may happen on-die as well. Increasing the available die area for the PA die may have a further advantage with respect to thermal dissipation.

As a specific example, although elements 100 and 200 are described as microelectronic packages, in some embodiments the elements 100 and 200 may be multi-function dies rather than microelectronic packages. Specifically, elements 105, 205a, 205b, 205c, etc. may be digital logic or some other component related to a function of an RF FEM such as a switch, an IPD, a PA, an LNA, an AWR, or some other element. Element 110 and 210 may be a die substrate rather than a package substrate. Other aspects of elements 100 and 200 may be similarly altered to change the scale from package-level to die-level while still include substrate-integrated elements such as inductors, trench vias, or other elements.

Figure 7:
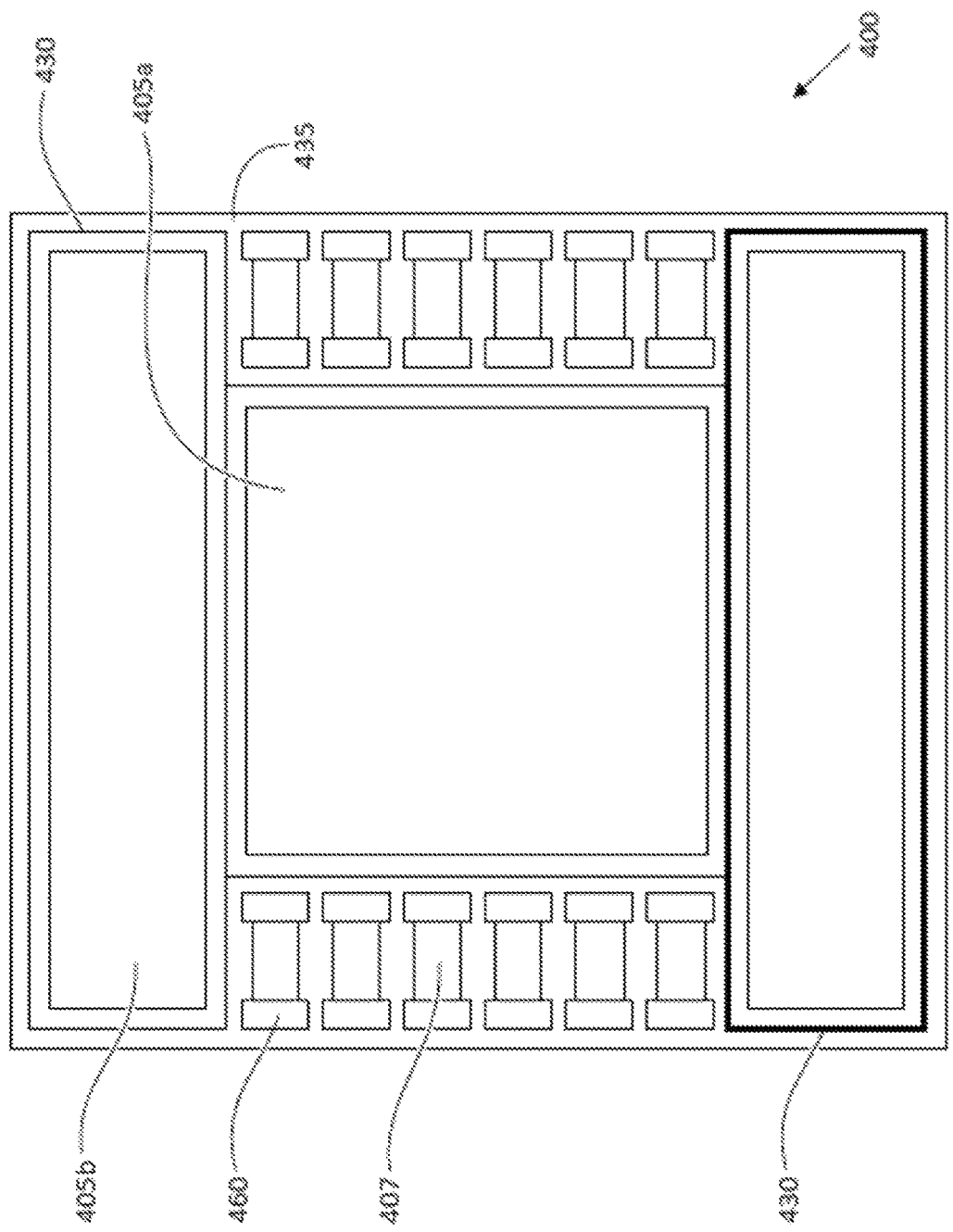
FIG. 7 depicts an alternative example microelectronic package with substrate-integrated components, in accordance with various embodiments.

FIG. 7 depicts an example microelectronic package with substrate-integrated components, in accordance with various embodiments. It will be understood that the embodiment of FIG. 7 is intended as an example embodiment, and other variations may more or fewer elements, elements in a different arrangement, etc.

Specifically, FIG. 7 may be a top-down view of a microelectronic package 400, which may include elements similar to those of microelectronic package 200. The microelectronic package 400 may include an overmold material 435, which may be similar to overmold materials 135 or 235. The microelectronic package 400 may further include a number of TMVs 430, which may be similar to TMVs 130 or 230.

The microelectronic package 400 may further include a number of dies 405a and 405b. The dies 405a and 405b may be multi-functionality dies as described above. For example, die 405a may incorporate digital logic or other components relating to a functionality of an RF FEM such as a PA, digital logic, an IPD, a switch, etc. Similarly, die 405b may by a multi-functionality die that implements a number of AWR filters with or without integrated passive components. For example, each of the AWR filters may be related to a different bandwidth. It will be understood that these multiple functionalities are described herein as examples, and other dies may incorporate more or fewer, or different functionalities, or may be single-functionality dies.

The microelectronic package 400 may further include a number of SMDs 407 which are coupled with the package substrate of the microelectronic package by a number of pads 460. The SMDs 407 may be, for example, inductors, capacitors, resistors, etc.

Figure 8:
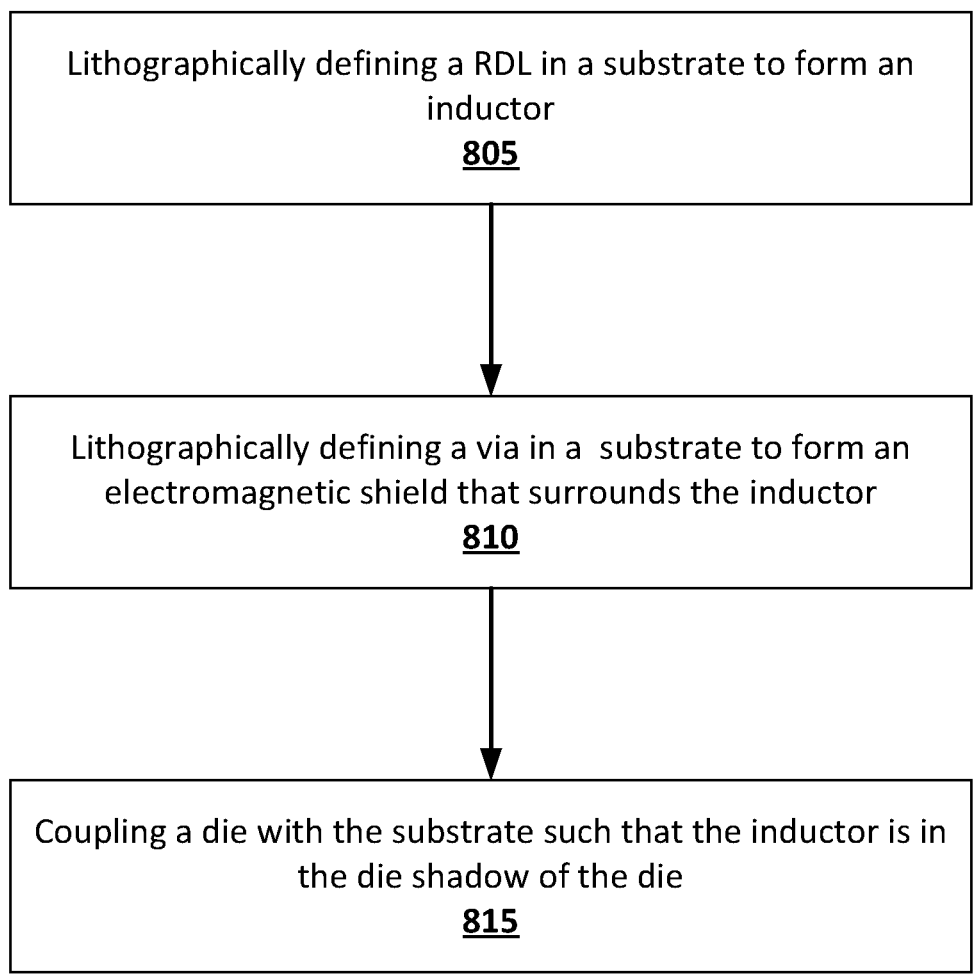
FIG. 8 an example technique for manufacturing a microelectronic package with substrate-integrated components, in accordance with various embodiments.

FIG. 8 an example technique for manufacturing a microelectronic package with substrate-integrated components, in accordance with various embodiments. Generally, embodiments may be described with respect to the microelectronic package 100 of FIG. 1, however it will be understood that the described technique may be applicable, in whole or in part, with or without modification, to other embodiments herein.

The technique may include lithographically defining, at 805, a trace in a substrate to form an inductor. The trace may be similar to, for example, trace 150 that is defined in substrate 110. As discussed with respect to microelectronic package 200 or inductor 309, the trace may, in conjunction with traces of other redistribution layers of the substrate, define an inductor such as inductor 309.

The technique may further include lithographically defining, at 810, a via in a substrate to form an electromagnetic shield that surrounds the inductor. The via may be similar to, for example, vias 145 or TSVs 211. As described with respect to microelectronic package 200, the vias may, in conjunction with EMI shields such as EMI shields 217 and EMI shield layer 140, form an electromagnetic shield that generally surrounds an inductor, a die, or both.

The technique may further include coupling, at 815, a die with the package substrate such that the inductor is in the die shadow of the die. The die may be similar to, for example, die 105 or some other die discussed or descried herein.

It will be understood that the embodiment described above with respect to FIG. 8 is intended as a highly simplified example technique, and other embodiments may vary from the embodiment depicted herein. For example, certain elements may be performed in an order differently than what is depicted, elements may be performed concurrently with one another, elements may be added or subtracted, etc.

Figure 9:
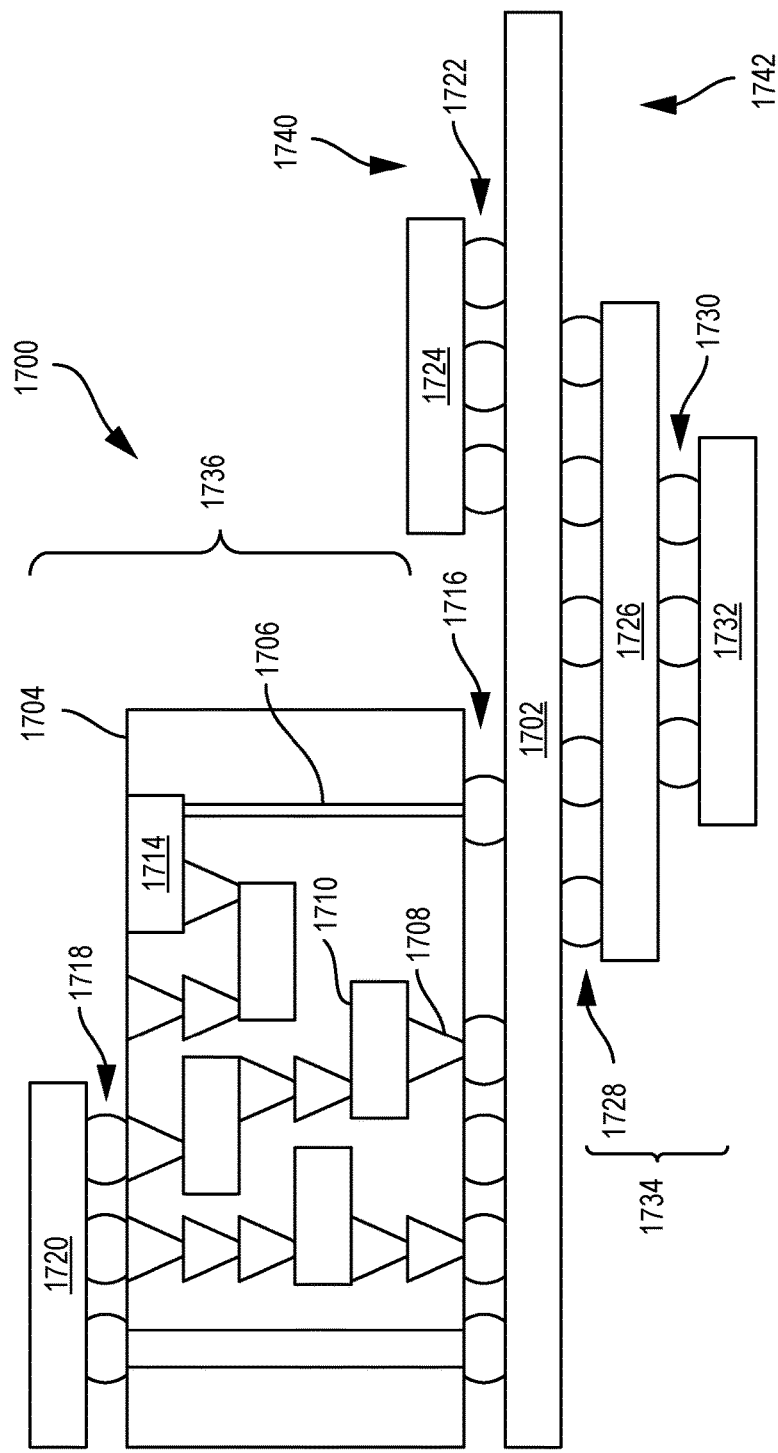
FIG. 9 is a side, cross-sectional view of an integrated circuit (IC) device assembly that may include a microelectronic package with substrate-integrated components, in accordance with various embodiments.

FIG. 9 is a side, cross-sectional view of an IC device assembly 1700 that may include one or more IC packages or other electronic components (e.g., a die) including one or more microelectronic packages with substrate-integrated components, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 9 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 9), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 9, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die, an IC device, or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 9, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to TSVs 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, PAs, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may include one or more substrate-integrated components.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 9 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 10:
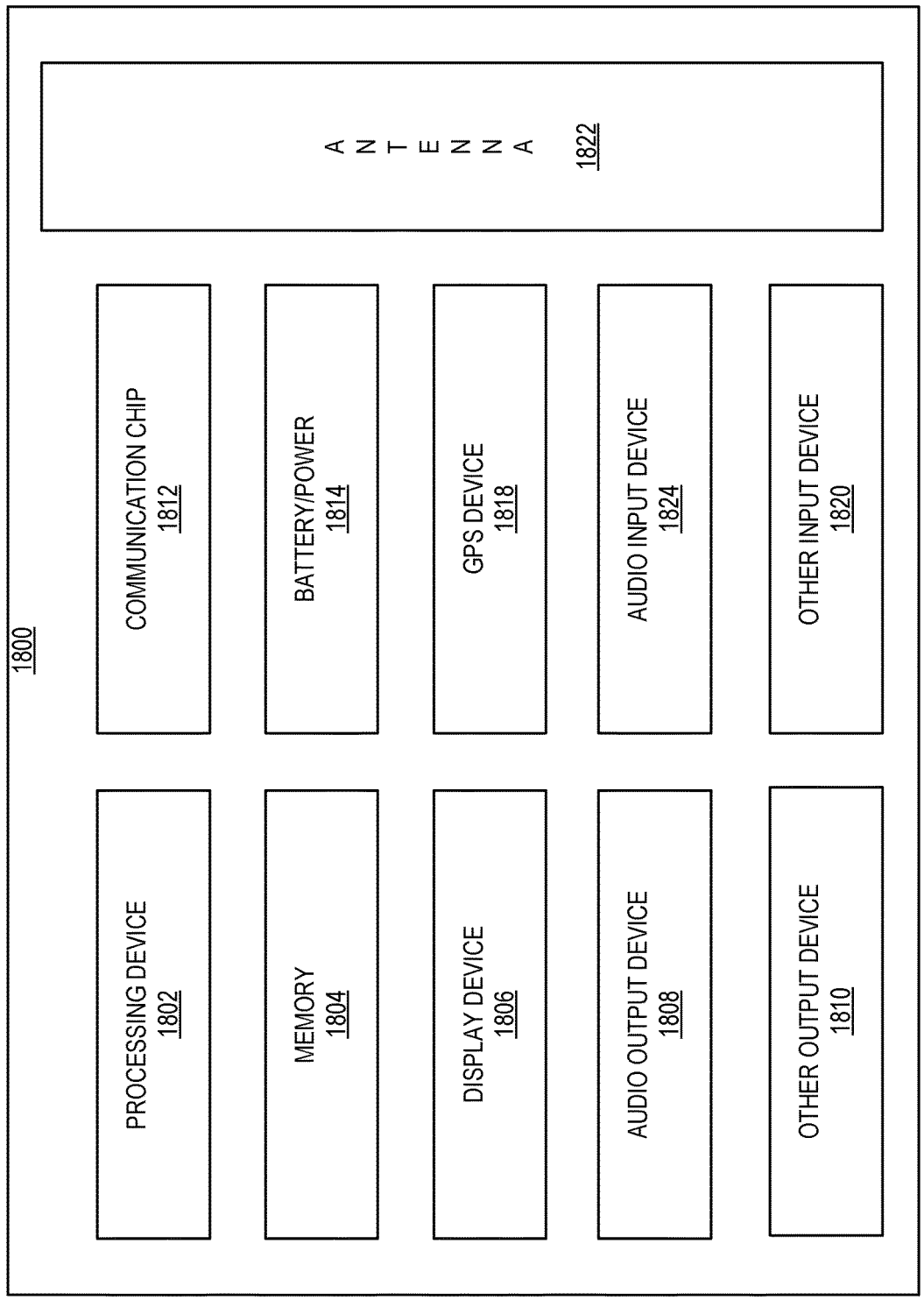
FIG. 10 is a block diagram of an example electrical device that may include a microelectronic package with substrate-integrated components, in accordance with various embodiments.

FIG. 10 is a block diagram of an example electrical device 1800 that may include one or more microelectronic packages with substrate-integrated components, in accordance with any of the embodiments disclosed herein. For example, any suitable ones of the components of the electrical device 1800 may include one or more of the IC device assemblies 1700, IC packages, IC devices, or dies disclosed or discussed herein. A number of components are illustrated in FIG. 10 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 10, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), ASICs, CPUs, GPUs, cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random-access memory (DRAM)), nonvolatile memory (e.g., ROM), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

EXAMPLES OF VARIOUS EMBODIMENTS

Example 1 includes a microelectronic package comprising: a substrate with a plurality of layers; a die coupled with a face of the substrate; an inductor positioned in the substrate and within a die shadow of the die; and electromagnetic interference (EMI) shield elements positioned within the substrate and surrounding the inductor.

Example 2 includes the microelectronic package of example 1, wherein the inductor includes a metal element positioned in two layers of the substrate.

Example 3 includes the microelectronic package of example 1, wherein the inductor includes a conductive element in a first layer of the package substrate, a conductive element in a second layer of the package substrate, and a conductive element in a third layer of the package substrate, and wherein the conductive elements of the first layer and the second layer are electronically coupled by a trench via.

Example 4 includes the microelectronic package of example 1, wherein the EMI shield elements include a through-substrate via (TSV) within the substrate.

Example 5 includes the microelectronic package of any of examples 1-4, wherein the EMI shield elements further surround the die.

Example 6 includes the microelectronic package of any of examples 1-4, wherein the die is a power amplifier (PA) or an acoustic wave resonator (AWR).

Example 7 includes the microelectronic package of any of examples 1-4, wherein the plurality of layers includes a first subset of layers wherein respective layers of the first subset of layers has a first z-height, and the plurality of layers includes a second subset of layers wherein respective layers of the second subset of layers has a second z-height.

Example 8 includes the microelectronic package of any of examples 1-4, wherein the microelectronic package has a z-height of less than 300 micrometers ("microns").

Example 9 includes a die for use in a radio frequency (RF) front-end module (FEM), wherein the die comprises: a substrate; a first subsystem related to a first function of the RF FEM, wherein the first subsystem is coupled with the substrate; a second subsystem related to a second function of the RF FEM, wherein the second subsystem is coupled with the substrate; and a trench via located in the substrate and communicatively coupled to the first subsystem and the second subsystem.

Example 10 includes the die of example 9, wherein the first function is related to a power amplifier (PA) and the second function is related to an integrated passive device (IPD), logic, or a switch.

Example 11 includes the die of examples 9 or 10, wherein the first function is related to a resonator, and the second function is related to a filter.

Example 12 includes the die of examples 9 or 10, wherein the substrate includes an inductor in the substrate, wherein the inductor is communicatively coupled to the first logic or the second logic.

Example 13 includes the die of example 12, wherein the inductor is electromagnetically shielded by a via in the substrate.

Example 14 includes a method of forming a microelectronic package for use in a radio frequency (RF) front-end module (FEM), wherein the method comprises: lithographically defining a trace in a substrate to form an inductor; lithographically defining a via in a substrate to form an electromagnetic shield that surrounds the inductor; and coupling a die with the substrate such that the inductor is in the die shadow of the die.

Example 15 includes the method of example 14, wherein the die includes a subsystem related to a first function of the RF FEM and a subsystem related to a second function of the RF FEM.

Example 16 includes the method of example 14, wherein the die is an acoustic wave resonator (AWR).

Example 17 includes the method of example 14, further comprising coupling a second die with the substrate.

Example 18 includes the method of any of examples 14-17, wherein lithographically defining the trace to form the inductor includes lithographically defining a first trace in a first layer of the substrate and a second trace in a second layer of the substrate, and communicatively coupling the first trace and the second trace.

Example 19 includes the method of example 18, wherein lithographically defining the trace to form the inductor further includes lithographically defining a third trace in a third layer of the substrate.

Example 20 includes the method of example 19, further comprising lithographically defining a trench via to communicatively couple the third trace and the second trace.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A microelectronic package, comprising:
a package substrate;
a die coupled with a face of the package substrate;
overmold material at least partially surrounding the die, wherein the overmold material comprises a conductive through-mold via (TMV) proximate to the die;
a first inductor and a second inductor positioned in the package substrate and within a die shadow of the die; and
electromagnetic interference (EMI) shield elements positioned within the package substrate and surrounding the first inductor and the second inductor, wherein:
the package substrate comprises a first redistribution layer having a first thickness and a second redistribution layer having a second thickness, the second thickness being less than the first thickness,
the first inductor is in the first redistribution layer,
the second inductor is in the second redistribution layer, and
the second inductor has a lower Q-factor than the first inductor.

2. The microelectronic package of claim 1, wherein at least one of the first inductor and the second inductor includes a metal element positioned in two layers of the package substrate.

3. The microelectronic package of claim 1, wherein at least one of the first inductor and the second inductor includes a conductive element in a first layer of the package substrate, a conductive element in a second layer of the package substrate, and a conductive element in a third layer of the package substrate, and wherein the conductive elements of the first layer and the second layer are electronically coupled by a trench via.

4. The microelectronic package of claim 1, wherein the EMI shield elements include a through-substrate via (TSV) within the package substrate.

5. The microelectronic package of claim 1, wherein the EMI shield elements further surround the die.

6. The microelectronic package of claim 1, wherein the die is a power amplifier (PA) or an acoustic wave resonator (AWR).

7. The microelectronic package of claim 1, wherein:
the package substrate includes a plurality of layers,
the plurality of layers includes a first subset of layers comprising the first redistribution layer, wherein respective layers of the first subset of layers has a first z-height, and
the plurality of layers includes a second subset of layers comprising the second redistribution layer, wherein respective layers of the second subset of layers has a second z-height.

8. The microelectronic package of claim 1, wherein the microelectronic package has a height of less than 300 micrometers.

9. The microelectronic package of claim 1, wherein the inductor is a multi-loop inductor.

10. The microelectronic package of claim 1, wherein the microelectronic package is a RF front-end module (FEM).

11. The microelectronic package of claim 1, further comprising an EMI shield layer above the overmold material over at least a portion of the die.

12. An electrical device, comprising:
a processing device; and
a communication chip,
wherein at least one of the processing device and the communication chip includes a microelectronic package that includes:
a package substrate comprising a first redistribution layer and a second redistribution layer, the second redistribution layer being thinner than the first redistribution layer,
a die coupled with a face of the package substrate,
overmold material at least partially surrounding the die, and comprising a conductive TMV proximate to the die,
a first inductor and a second inductor positioned in the first redistribution layer and the second redistribution layer respectively of the package substrate and within a die shadow of the die, and
electromagnetic interference (EMI) shield elements positioned within the package substrate and surrounding the inductor.

13. The electrical device of claim 12, wherein at least one of the first inductor and the second inductor includes a metal element positioned in two layers of the package substrate.

\* \* \* \* \*